US008884245B2

(12) United States Patent
Henstra et al.

(10) Patent No.: US 8,884,245 B2
(45) Date of Patent: Nov. 11, 2014

(54) CORRECTOR FOR THE CORRECTION OF CHROMATIC ABERRATIONS IN A PARTICLE-OPTICAL APPARATUS

(75) Inventors: Alexander Henstra, Utrecht (NL); Michael Ross Scheinfein, Portland, OR (US)

(73) Assignee: FEI Company, Hillsboro, OR (US)

( * ) Notice: Subject to any disclaimer, the term of this patent is extended or adjusted under 35 U.S.C. 154(b) by 741 days.

(21) Appl. No.: 11/591,175

(22) Filed: Nov. 1, 2006

(65) Prior Publication Data

US 2008/0290264 A1 Nov. 27, 2008

Related U.S. Application Data

(60) Provisional application No. 60/732,783, filed on Nov. 2, 2005.

(51) Int. Cl.
*G21K 5/00* (2006.01)
*H01J 37/26* (2006.01)
*H01J 37/153* (2006.01)

(52) U.S. Cl.
CPC .............. *H01J 37/153* (2013.01); *H01J 37/26* (2013.01); *H01J 2237/1534* (2013.01)
USPC ...................................... 250/398; 250/396 R

(58) Field of Classification Search
None
See application file for complete search history.

(56) References Cited

U.S. PATENT DOCUMENTS

| 2,919,381 A | 12/1959 | Glaser |
| 3,979,590 A | 9/1976 | Andersen |
| 4,095,104 A | 6/1978 | LePoole et al. |
| 4,303,864 A | 12/1981 | Crewe et al. |
| 4,362,945 A | 12/1982 | Riecke |
| 4,379,230 A | 4/1983 | Bouwhuis et al. |
| 4,389,571 A | 6/1983 | Crewe |
| 4,414,474 A | 11/1983 | Crewe |
| 4,560,878 A * | 12/1985 | Knauer et al. ............ 250/396 R |
| 4,618,766 A | 10/1986 | van der Mast et al. |
| 4,684,808 A | 8/1987 | Plies et al. |
| 4,853,545 A | 8/1989 | Rose |
| 4,859,857 A | 8/1989 | Stengl et al. |
| 4,962,313 A * | 10/1990 | Rose ............................ 250/311 |
| 5,084,622 A | 1/1992 | Rose |

(Continued)

FOREIGN PATENT DOCUMENTS

| DE | 4204512 | 8/1993 |
| DE | 19633496 | 2/1998 |

(Continued)

OTHER PUBLICATIONS

"Aberration Correction in Electron Microscopy," Materials, Science Division, Argonne National Laboratory, 16 p.

(Continued)

*Primary Examiner* — Andrew Smyth

(74) *Attorney, Agent, or Firm* — Scheinberg & Associates, PC; Michael O. Scheinberg

(57) ABSTRACT

The invention describes a corrector for the correction of chromatic aberrations in a particle lens, such as used in a SEM or a TEM. So as to reduce the stability demands on the power supplies of such a corrector, the energy with which the particle beam passes through the corrector is lower than the energy with which the beam passes through the lens to be corrected.

15 Claims, 3 Drawing Sheets

(56) References Cited

U.S. PATENT DOCUMENTS

Figure 1:
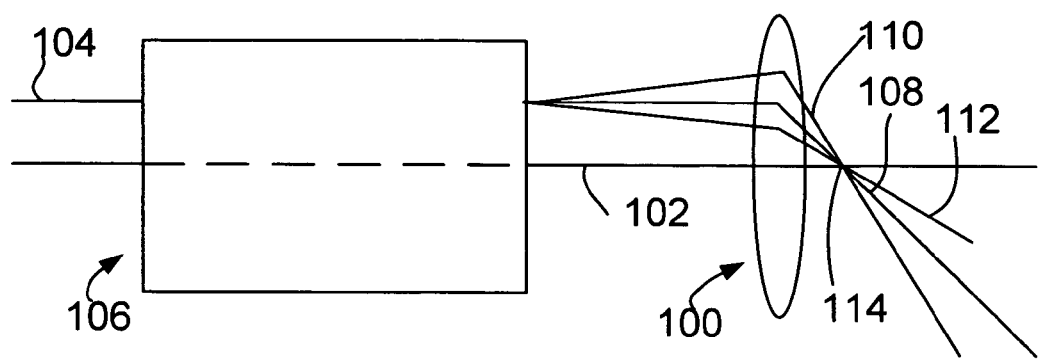

| | | | |
|---|---|---|---|
| 5,221,844 A | 6/1993 | van der Mast et al. | |
| 5,300,775 A | 4/1994 | Van der Mast | |
| 5,336,891 A | 8/1994 | Crewe | |
| 5,350,924 A * | 9/1994 | Stengl et al. | 250/492.2 |
| 5,422,486 A | 6/1995 | Herrmann et al. | |
| 5,432,347 A * | 7/1995 | Coene | 250/307 |
| 5,448,063 A | 9/1995 | De Jong et al. | |
| 5,581,347 A | 12/1996 | Le Saux et al. | |
| 5,798,524 A | 8/1998 | Kundmann et al. | |
| 5,838,011 A | 11/1998 | Krijn et al. | |
| 5,965,894 A | 10/1999 | Krijn et al. | |
| 5,986,269 A | 11/1999 | Krijn et al. | |
| 6,111,253 A * | 8/2000 | Tsuno | 250/311 |
| 6,184,975 B1 | 2/2001 | Henstra et al. | |
| 6,191,423 B1 | 2/2001 | Krijn et al. | |
| 6,246,058 B1 | 6/2001 | Tiemeijer | |
| 6,248,486 B1 | 6/2001 | Dirksen et al. | |
| 6,301,008 B1 | 10/2001 | Ziger et al. | |
| 6,329,659 B1 | 12/2001 | Krijn et al. | |
| 6,368,763 B2 | 4/2002 | Dirksen et al. | |
| 6,426,501 B1 | 7/2002 | Nakagawa | |
| 6,455,848 B1 | 9/2002 | Krijn et al. | |
| 6,489,621 B1 | 12/2002 | Frosien | |
| 6,552,340 B1 | 4/2003 | Krivanek et al. | |
| 6,605,810 B1 | 8/2003 | Haider et al. | |
| 6,693,282 B1 | 2/2004 | Tiemeijer | |
| 6,723,997 B2 * | 4/2004 | Matsuya et al. | 250/396 R |
| 6,737,647 B2 * | 5/2004 | Schonhense et al. | 850/9 |
| 6,770,887 B2 | 8/2004 | Krivanek et al. | |
| 6,844,548 B2 * | 1/2005 | Lopez et al. | 250/305 |
| 6,852,983 B2 * | 2/2005 | Matsuya et al. | 250/396 ML |
| 6,858,844 B2 | 2/2005 | Zach | |
| 6,888,145 B2 | 5/2005 | Muller et al. | |
| 6,924,488 B2 * | 8/2005 | Matsuya et al. | 250/396 R |
| 6,943,349 B2 | 9/2005 | Adamec et al. | |
| 6,946,657 B2 * | 9/2005 | Kienzle et al. | 250/310 |
| 7,005,641 B2 | 2/2006 | Nakasuji et al. | |
| 7,012,262 B2 | 3/2006 | Rose | |
| 7,034,315 B2 | 4/2006 | Henstra et al. | |
| 7,060,986 B2 * | 6/2006 | Nakamura et al. | 250/396 R |
| 7,164,128 B2 | 1/2007 | Miyamoto et al. | |
| 7,282,722 B2 * | 10/2007 | Sato et al. | 250/398 |
| 7,378,667 B2 | 5/2008 | Henstra | |
| 7,408,172 B2 | 8/2008 | Sato et al. | |
| 7,518,121 B2 | 4/2009 | Maas et al. | |
| 7,544,939 B2 | 6/2009 | van der Zande et al. | |
| 8,319,193 B2 * | 11/2012 | Kasuya et al. | 250/423 F |
| 2003/0226975 A1 * | 12/2003 | Lopez et al. | 250/396 R |
| 2004/0000646 A1 * | 1/2004 | Schonhense et al. | 250/397 |
| 2004/0036021 A1 * | 2/2004 | Todokoro et al. | 250/310 |
| 2004/0036030 A1 * | 2/2004 | Matsuya et al. | 250/396 R |
| 2004/0144920 A1 * | 7/2004 | Lopez et al. | 250/305 |
| 2005/0045821 A1 * | 3/2005 | Noji et al. | 250/311 |
| 2005/0247884 A1 * | 11/2005 | Nakamura et al. | 250/396 R |
| 2005/0253083 A1 * | 11/2005 | Sato et al. | 250/398 |
| 2005/0285036 A1 * | 12/2005 | Sato et al. | 250/310 |
| 2007/0057183 A1 * | 3/2007 | Arai et al. | 250/310 |

FOREIGN PATENT DOCUMENTS

| | | | |
|---|---|---|---|
| GB | 1364930 | 8/1974 | |
| JP | 1264149 | 10/1989 | |
| JP | 2004087460 | 3/2004 | |
| JP | 2004087460 A * | 3/2004 | H01J 37/10 |
| JP | 2007180013 | 7/2007 | |
| WO | 03032351 | 4/2003 | |

OTHER PUBLICATIONS

Christian Kisielowski, Bernd Kabius, Rimei Zhu, Ray D. Twensten and Ian M. Anderson, "Third Team Workshop," San Antonio, Texas Aug. 8, 2003, 43 p.

Japanese Office Action, Sep. 4, 2012, 3 pages.

Haider, M. et al., "Upper Limits for the Residual Aberrations of a High-Resolution Aberration-Corrected STEM," Ultramicroscopy, 2000, pp. 163-175, vol. 81.

Koops, H., "Aberration Correction in Electron Microscopy," The Instrument Today and Tomorrow, Ninth International Congress on Electron Microscopy, Publication Date Unknown, Toronto, pp. 185-196.

Jones, H.W., "An Apparatus for Determining the Secondary Electron Emission Properties of Nonconductors," Journal of Physics E. Scientific Instruments, Dec. 1, 1970, pp. 997-999, vol. 3, No. 12.

Carson, K.R. et al., "An Improved Standard Specimen for Alignment of Electron Microscopes," Journal of Science Instruments, 1967, pp. 1036-1037, vol. 44.

Ohnishi, T. et al., "Development of an FIB System Using a Ga—In—Sn LMIS," Central Research Laboratory, Hitachi Ltd., Publication Date Unknown, pp. 101-104.

Bernhard, W., "Erprobung Eines Spharisch Und Chromatisch Korrigierten Elektronenmikroskopes," Optik, 1980, pp. 73-94, vol. 57, No. 1.

Mitrofanov A.V. et al, "INSPEC/IEE," 1992, 1 Page.

Krohn, V.E. et al., "Ion Source of High Brightness Using Liquid Metal," Applied Physics Letters, Nov. 1975, pp. 479-481, vol. 27, No. 9.

Hibi, T. et al., "On a Slit for Objective Electron Lens," Research Institute for Scientific Measurements, 1954, pp. 511-516, vol. 6.

Hasimoto, H. et al., "Pseudo-Aberration Free Focus Condition for Atomic Resolution Electron Microscope Images," Micron, 1998, pp. 113-121, vol. 29, No. 2/3.

Canemco, "Scanning Electron Microscopy Supplies," Webpages, www.canemco.com, Publication Date Unknown, 33 Pages.

Canemco, "SEM Calibration Standards," Webpages, www.canemco.com, Publication Date Unknown, 1 Page.

Joy, D.C., "SEM Parameters and their Measurement," Scanning Electron Microscopy, Apr. 1974, pp. 327-334, Part 1.

Guiton, B. et al., "Single-Crystalline Vanadium Dioxide Nanowires with Rectangular Cross Sections," J. Am. Chem. Soc., 2005, pp. 498-499, vol. 127.

Kaynig, V. et al., "Probabilistic Image Registration and Anomaly Detection by Nonlinear Warping," Computer Vision and Pattern Recognition, IEEE Conference, Jun. 2008, pp. 1-8.

Lowe, D., "Distinctive Image Features from Scale-Invariant Keypoints," International Journal of Computer Vision, 2004, pp. 91-110, vol. 60, No. 2.

Heckman, F.A. et al., "The Reduction of Error in Magnification Determination in Electron Microscopes," Electron Microscopy, Fifth International Congress, Aug. 1962, 2 Pages, vol. 1.

* cited by examiner

CORRECTOR FOR THE CORRECTION OF CHROMATIC ABERRATIONS IN A PARTICLE-OPTICAL APPARATUS

This application claims priority from U.S. Provisional Pat. App. 60/732,783, filed Nov. 2, 2005, which is hereby incorporated by reference.

The invention relates to a particle-optical apparatus arranged to focus a beam of electrically charged particles, provided with:
- a particle source for generating the beam;
- a particle-optical lens for focusing the beam; and,
- a corrector for correcting the chromatic lens errors occurring in the lens.

A corrector for use in such an apparatus is known from US patent application with publication number US 2004/0036030 A1.

Such apparatus are known inter alia by the terms Scanning Electron Microscope (SEM), Transmission Electron Microscope (TEM), STEM (Scanning Transmission Electron Microscope), FIB (Focused Ion Beam apparatus) and Dual Beam Microscope (in which both an ion beam and an electron beam are used).

Such apparatus are used nowadays inter alia in examining biological samples and in examining specimens taken from semiconductors.

In general, a sample can be irradiated with a focused particle beam or with a non-focused particle beam. In irradiating a sample with a focused ion beam that is rastered across the sample, as occurs in a SEM, a STEM and a FIB, for example, information can be obtained in various manners, such as by detecting secondary particles and radiation excited in the sample, for example. The surface of the sample can also be modified by deposition or etching ("milling"). In irradiating a sample with a non-focused beam, usually a parallel beam, information can be obtained from the particles that pass through the sample. Such information may include energy loss in the particles, scattering (deflection) of particles, etc.

In such an apparatus, a beam of electrically charged particles is generally emitted by a particle source and accelerated to a desired energy by an electric field. The beam is subsequently manipulated with the aid of, for example, particle-optical lenses and particle-optical deflectors, after which the beam illuminates the sample. Illumination of the sample can, for example, occur with a parallel-incident beam, but it is also possible to form a point-like image. In both instances, it is important that lens errors disturb the form of the beam to as little an extent as possible.

The operation of a particle-optical lens relies on the phenomenon that the electrically charged particles are deflected by electric and/or magnetic fields. In a majority of particle-optical lenses used nowadays, the magnetic and/or electric field of the lens demonstrates rotational symmetry about an axis—the optical axis of the lens.

Chromatic aberration is caused by the fact that the lens generally demonstrates a different lens action for particles with different energies. Because a particle source such as an electron source generally emits particles with somewhat different energies, and the particles are accelerated by an (electric) field that that is not entirely constant in time, the beam of particles incident upon the lens will be characterized inter alia by a certain energy spread $\Delta\phi$ and a nominal particle energy $\phi$, and, consequently, not all particles will be focused at the same location by a lens.

So as to minimize the effect of the lens errors referred to above, use can be made of correctors.

As is known to the skilled artisan, the lens errors of a particle-optical lens can be corrected by subjecting the beam to a plurality of magnetic and/or electric multipole fields, such as dipole fields, quadrupole fields, hextupole fields and octupole fields, and possibly also rotationally symmetric lens fields.

The known corrector described in patent application US 2004/0036030 A1 can be part of a SEM or a TEM, whereby the beam of charged particles in the form of an electron beam is accelerated to a desired energy, after which the beam with this energy traverses the known corrector and the lens.

From the known document, it cannot be derived at what energy the beam traverses the corrector.

As is known inter alia from "Advantages of Chromatic Aberration Correction for Material Science Research", B. Kabius & D. J. Miller, 3$^{rd}$ TEAM Workshop, San Antonio, Aug. 8, 2003, page 40 (http://ncem.lbl.gov/teamfTEAM3%20wkshp%20rpt.pdf), the demands that are placed on the power supplies of the multipole elements necessary for the correction of chromatic errors are very high. For a TEM with a nominal beam energy of 200 kV, stabilities of 0.1 ppm ($10^{-7}$) are referred to. Although this is attainable, it lies at the boundaries of what is technically possible. In this context, one must remember that the voltages that are employed to generate the necessary electric fields in a corrector for a 200 kV beam often amount to one or more kV. This makes it additionally difficult to achieve such stabilities. This is because, at such voltages, creep currents, leakage currents and arc-over currents occur, which can adversely influence the stability.

The invention aims to provide a corrector for the correction of chromatic lens errors, whereby less stringent demands are placed on the stability of the power supplies for the multipole elements and rotationally symmetric lenses of the corrector.

To this end, an apparatus according to the invention is characterized in that it is embodied in such a manner that the beam traverses at least a portion of the corrector with an energy lower than the energy with which the beam traverses the lens.

The invention is based upon the insight that, although a corrector that corrects chromatic errors is normally constructed in such a manner that the beam in the corrector has the same energy as in the lens to be corrected, this is not necessary. By choosing the energy of the beam in the corrector to be lower than in the lens, it transpires that the stability of the corrector power supplies becomes less critical. Using suitable transfer optics (consisting of, for example, rotationally symmetric lenses and acceleration fields) the beam between the corrector and the lens can be accelerated in such a manner that the beam traverses the lens with a potential different from the potential in the corrector.

It ought to be mentioned that, normally speaking, the lens is situated between the location where the corrected lens action is required and the corrector, even though this is not necessary. For an objective lens (which is located between the particle source and the sample), the corrector is then located at the source side of the lens; for a projection lens (whereby the sample is located between the projection lens and the particle source), the corrector is then located further from the particle source than from the lens.

It ought to be mentioned that the realization of such a corrector (albeit without indicating how such a corrector can be embodied) has been proposed by experts, but has met with direct rejection as being impractical: see the reply by Dr. Haider to the question by Prof. A. Eades, as set forth in TEAM workshop report, July 2000, page 21 (http://ncem.lbl.gov/team/TEAM%20Report%202000.pdf). Such mentioning of the possibility of embodying a corrector in such a manner, and the prompt rejection thereof, is a founded determination for the skilled artisan that would deter the skilled artisan from analyzing technical teaching and, accordingly, cannot be seen as a publication that enables the skilled artisan to realize the aforementioned.

FURTHER ELUCIDATION OF THE THEORETICAL BACKGROUND OF THE INVENTION

The invention will be explained on the basis of general paraxial calculations performed upon the combination of a corrector, transfer optics and lens in a probe-forming system as applied in STEM (Scanning Transmission Electron Microscopy). Such a system is shown in FIG. 1. It is assumed that the lens is illuminated by an approximately parallel beam, although this is not necessary.

The beam can be regarded as being composed of rays, which propagate parallel to the axis. Each ray is described by $$\begin{pmatrix} r \\ r' \end{pmatrix}_z,$$

whereby, at position z along the optical axis, r is the distance from the ray to the optical axis and r' is the angle that the ray subtends with the optical axis.

The effect of a (thin) lens without chromatic aberration is described by:

$$\begin{pmatrix} r \\ r' \end{pmatrix}_{out} = \begin{pmatrix} 1 & 0 \\ -1/f & 1 \end{pmatrix} \begin{pmatrix} r \\ r' \end{pmatrix}_{in} \qquad [1]$$

whereby f is the focal length of the lens. Introduction of the effect of first-order axial chromatic aberration in formula [1] gives:

$$\begin{pmatrix} r \\ r' \end{pmatrix}_{out} = \begin{pmatrix} 1 & 0 \\ -\frac{1}{f}\left[1 - \frac{C_c}{f}\frac{\Delta\phi}{\phi_{lens}}\right] & 1 \end{pmatrix} \begin{pmatrix} r \\ r' \end{pmatrix}_{in} \qquad [2]$$

whereby $C_c$ is the axial chromatic aberration coefficient of the lens, $\Delta\phi$ is the energy spread in the beam, and $\phi_{lens}$ is the energy of the beam in the lens.

Before giving a more general description of the behavior of a corrector, a simple corrector will first be described, namely a so-called straight-sighted corrector with a telescopic magnification of 1. Such a corrector is depicted in FIG. 1, together with the lens to be corrected.

In the case of a straight-sighted corrector, a ray that is incident parallel to the axis of the corrector (i.e. $r'_{in}=0$) will also emerge parallel to the axis of the corrector ($r'_{out}=0$). A magnification of 1 means that this ray will emerge from the corrector at the same height as it entered the corrector (i.e. $r_{out}=r_{in}$).

For a ray incident upon the corrector parallel to the axis of the corrector, the emergent ray is described by:

$$\begin{pmatrix} r \\ r' \end{pmatrix}_{corr} = \begin{pmatrix} r_0(1 + a\Delta\phi/\phi_{lens}) \\ -r_0\kappa_{corr}\Delta\phi/\phi_{lens} \end{pmatrix} \qquad [3]$$

whereby
- $\kappa_{corr}$ indicates the strength of the corrector (whereby $\kappa_{corr}>0$); and,
- "a" indicates the effect whereby a ray that has a deviant energy will emerge from the detector at a deviant height—the so-called chromatic magnification error.

Often, the corrector will be designed in such a manner that a is equal to 0, so that no chromatic magnification error occurs, and also none of the other errors attendant thereto.

In order to see now at what height and at what angle the ray is incident upon the lens, the effect of the space between the corrector and the lens—the so-called drift space—is calculated:

$$\begin{pmatrix} r \\ r' \end{pmatrix}_{lens,in} = \begin{pmatrix} 1 & d \\ 0 & 1 \end{pmatrix} \begin{pmatrix} r_0(1 + a\Delta\phi/\phi_{lens}) \\ -r_0\kappa_{corr}\Delta\phi/\phi_{lens} \end{pmatrix} \qquad [4]$$

$$= \begin{pmatrix} r_0(1 + \tilde{a}\Delta\phi/\phi_{lens}) \\ -r_0\kappa_{corr}\Delta\phi/\phi_{lens} \end{pmatrix}$$

whereby $\tilde{a} = a - d \cdot \kappa_{corr}$ and $$\begin{pmatrix} 1 & d \\ 0 & 1 \end{pmatrix}$$

is the transfer matrix of the drift space.

The image plane of the lens is equal to the rear focal plane of this lens, and thus lies at a distance f behind the lens. The height of the ray in the image plane is obtained by multiplying the vector of the beam that is incident upon the lens by the transfer matrix of the lens given in formula [2] and the transfer matrix of a drift space with a length f.

$$\begin{pmatrix} r \\ r' \end{pmatrix}_{imageplane} = \begin{pmatrix} 1 & f \\ 0 & 1 \end{pmatrix} \begin{pmatrix} 1 & 0 \\ -\frac{1}{f}\left[1 - \frac{C_c}{f}\frac{\Delta\phi}{\phi_{lens}}\right] & 1 \end{pmatrix} \begin{pmatrix} r \\ r' \end{pmatrix}_{lens,in} = \qquad [5]$$

$$= \begin{pmatrix} \frac{C_c}{f}\frac{\Delta\phi}{\phi_{lens}} & f \\ -\frac{1}{f}\left[1 - \frac{C_c}{f}\frac{\Delta\phi}{\phi_{lens}}\right] & 1 \end{pmatrix} \begin{pmatrix} r \\ r' \end{pmatrix}_{lens,in}$$

Substituting equation [4] in equation [5] renders the height of the beam in the image plane of the lens:

$$\begin{pmatrix} r \\ r' \end{pmatrix}_{image} = \begin{pmatrix} \frac{C_c}{f}\frac{\Delta\phi}{\phi_{lens}} & f \\ -\frac{1}{f}\left[1 - \frac{C_c}{f}\frac{\Delta\phi}{\phi_{lens}}\right] & 1 \end{pmatrix} \begin{pmatrix} r_0(1 + \tilde{a}\Delta\phi/\phi_{lens}) \\ -r_0\kappa_{corr}\Delta\phi/\phi_{lens} \end{pmatrix} \qquad [6]$$

When terms higher than the first order in $\Delta\phi/\phi_{lens}$ are neglected, this yields, as regards the height in the image plane of the lens:

$$r_{image} = r_0\left(\frac{C_c}{f} - f\kappa_{corr}\right)\frac{\Delta\phi}{\phi_{lens}} \qquad [7]$$

In the case of a corrected image, this height in the image plane should be equal to 0, and this yields the condition for the strength of the corrector:

$$\kappa_{corr} = C_c/f^2 \qquad [8]$$

A more general elucidation will now be given, again in the case of a straight-sighted corrector with a telescopic magnification of 1, which elucidation can be distinguished in the following ways from the calculations pertaining to the aforementioned, simple corrector:

- Transfer optics with a magnification M are located between the corrector and the lens;
- These transfer optics, in particular, change the energy of the beam;

The energy of the particles in the corrector is thus unequal to the energy of the particles in the lens;

The effect of instabilities in the corrector power supplies is calculated.

The influence of instabilities in the corrector manifests itself in the form of varying powers of the multipoles that form the corrector. As a result of a fluctuation in current (for generating magnetic fields) and voltage (for generating electric fields) the beam will be slightly deflected.

As is known to the skilled artisan, a dipole field will give a deflection in one direction, a quadrupole field will give a deflection that is linearly dependent upon the height at which the beam is incident, etc. Accordingly, the influence of instabilities in the power supplies of the corrector, which give rise to additional deflections, can be taken into account in formula [3]:

$$\begin{pmatrix} r \\ r' \end{pmatrix}_{corr} = T_{corr}\begin{pmatrix} r_0 \\ 0 \end{pmatrix} = \begin{pmatrix} r_0 \\ -r_0\kappa_{corr}\Delta\phi/\phi_{corr} \end{pmatrix} + \begin{pmatrix} 0 \\ N \end{pmatrix} \quad [9]$$

wherein $N=N_2+N_4 r_0+N_6 r_0^2 + \ldots$ whereby $N_2$ describes the effect of dipole fields, $N_4$ describes the effect of quadrupole fields, etc.

It ought to be mentioned that the effect of multipole fields is not equally strong in each direction perpendicular to the axis, and that the use of the variable r is, strictly speaking, incorrect. However, seeing as the other elements (lens, drift space) are rotationally symmetric, one can envisage the variable r as being associated with that direction perpendicular to the axis whereby the effect of N is the greatest.

As is known to the skilled artisan, lenses that collectively form the so-called transfer optics are often located between the corrector and the lens. The purpose of these transfer optics is to take the beam that emerges from the corrector and offer it in a suitable manner to the lens. Such a suitable manner may, for example, entail that all particles of a ray that enters the corrector should meet each other in the principal plane of the lens, regardless of their energy. In addition, the transfer optics are characterized by a geometric magnification M.

Seeing as the beam energy $\phi_{corr}$ in the corrector differs from the beam energy $\phi_{lens}$ in the lens to be corrected, acceleration (or deceleration) will occur between the corrector and the lens. This acceleration is assumed to occur in the transfer optics. The transfer matrix of the transfer optics is given by:

$$T_{transf} = \begin{pmatrix} M & 0 \\ 0 & \frac{1}{M}\sqrt{\frac{\phi_{corr}}{\phi_{lens}}} \end{pmatrix} \quad [10]$$

Naturally, the determinant of the transfer matrix is det $(T_{transf})=\sqrt{\phi_{corr}/\phi_{lens}}$, in accordance with the Helmholtz-Lagrange identity.

It ought to be mentioned that the two coefficients that have a value 0 do not have to have this value; however, as is known to the skilled artisan, this is desirable for a parallel-in/parallel-out system whereby further aberrations are small. It is also known to the skilled artisan how the transfer optics can be designed in such a way that the chromatic errors in those transfer optics can be neglected.

After the corrector and transfer optics, one obtains:

$$\begin{pmatrix} r \\ r' \end{pmatrix}_{\substack{corr+\\transf}} = \begin{pmatrix} M & 0 \\ 0 & \frac{1}{M}\sqrt{\frac{\phi_{corr}}{\phi_{lens}}} \end{pmatrix}\begin{pmatrix} r_0 \\ -r_0\kappa_{corr}\Delta\phi/\phi_{corr}+N \end{pmatrix}, \quad [11]$$

and in the image plane of the lens, one obtains:

$$\begin{pmatrix} r \\ r' \end{pmatrix}_{image} = \begin{pmatrix} \frac{C_c}{f}\frac{\Delta\phi}{\phi_{lens}} & f \\ -\frac{1}{f}\left[1-\frac{C_c}{f}\frac{\Delta\phi}{\phi_{lens}}\right] & 1 \end{pmatrix}\begin{pmatrix} M & 0 \\ 0 & \frac{1}{M}\sqrt{\frac{\phi_{corr}}{\phi_{lens}}} \end{pmatrix}\begin{pmatrix} r_0 \\ -r_0\kappa_{corr}\Delta\phi/\phi_{corr}+N \end{pmatrix} \quad [12^a]$$

$$= \begin{pmatrix} \frac{MC_c}{f}\frac{\Delta\phi}{\phi_{lens}} & \frac{f}{M}\sqrt{\frac{\phi_{corr}}{\phi_{lens}}} \\ -\frac{M}{f}\left[1-\frac{C_c}{f}\frac{\Delta\phi}{\phi_{lens}}\right] & \frac{1}{M}\sqrt{\frac{\phi_{corr}}{\phi_{lens}}} \end{pmatrix}\begin{pmatrix} r_0 \\ -r_0\kappa_{corr}\Delta\phi/\phi_{corr}+N \end{pmatrix} \quad [12^b]$$

$$= \begin{pmatrix} r_0\frac{MC_c}{f}\frac{\Delta\phi}{\phi_{lens}} - (r_0\kappa_{corr}\Delta\phi/\phi_{corr}+N)\left(\frac{f}{M}\sqrt{\frac{\phi_{corr}}{\phi_{lens}}}\right) \\ -r_0\frac{M}{f}\left[1-\frac{C_c}{f}\frac{\Delta\phi}{\phi_{lens}}\right] - (r_0\kappa_{corr}\Delta\phi/\phi_{corr}+N)\frac{1}{M}\sqrt{\frac{\phi_{corr}}{\phi_{lens}}} \end{pmatrix}$$

$$[12^c]$$

wherein the first matrix in formula $[12^a]$ is the matrix for a thin lens followed by a drift space with length f.

The height in the image plane of the lens is thus given by:

$$r_{image} = r_0\frac{MC_c}{f}\frac{\Delta\phi}{\phi_{lens}} - (r_0\kappa_{corr}\Delta\phi/\phi_{corr}+N)\left(\frac{f}{M}\sqrt{\frac{\phi_{corr}}{\phi_{lens}}}\right) \quad [13]$$

Eliminating r and substituting $\alpha=-Mr_0/f$, in which $\alpha$ is the opening angle on the image side of the lens, gives the following:

$$r_{image} = \begin{aligned} -\alpha\left(C_c - \kappa_{corr}\frac{f^2}{M^2}\sqrt{\frac{\phi_{lens}}{\phi_{corr}}}\right)\frac{\Delta\phi}{\phi_{lens}} + \\ \frac{f}{M}\sqrt{\frac{\phi_{corr}}{\phi_{lens}}}\left(N_2 - N_4\alpha\frac{f}{M}\right) \end{aligned} \quad [14]$$

whereby terms $N_6$ and higher have been neglected.

Correction of the chromatic aberration of the lens therefore takes place if:

$$\kappa_{corr} = C_c \frac{M^2}{f^2} \sqrt{\frac{\phi_{corr}}{\phi_{lens}}}. \quad [15]$$

It ought to be mentioned that $$\frac{f}{M} \sqrt{\frac{\phi_{corr}}{\phi_{lens}}} \left( N_2 - N_4 \alpha \frac{f}{M} \right)$$

in formula [14] is hereby assigned a value of 0, seeing as this term gives the effect of instabilities whose magnitude cannot be predicted. Moreover, the effect of this term is different in different directions perpendicular to the axis, as already discussed.

From formula [15], one obtains the magnification M of the transfer optics:

$$M = f \sqrt{\frac{\kappa_{corr}}{C_c}} \left( \frac{\phi_{lens}}{\phi_{corr}} \right)^{1/4}. \quad [16]$$

The position as a result of disturbance fields N in the image plane $r_{image}$ can be re-written as follows:

$$r_{image} = N_2 \sqrt{\frac{C_c}{\kappa_{corr}}} \left( \frac{\phi_{corr}}{\phi_{lens}} \right)^{3/4} - N_4 \alpha \frac{C_c}{\kappa_{corr}} \frac{\phi_{corr}}{\phi_{lens}}. \quad [17]$$

All of this leads to the insight that, in the case of constant energy $\phi_{lens}$ of the beam in the lens, constant focal length f and chromatic aberration coefficient $C_c$ of the lens, and constant strength $\kappa_{corr}$ of the corrector, by choosing $\phi_{corr} \ll \phi_{lens}$, the influence of disturbing deflection fields ($=N_2$) is a factor $(\phi_{corr}/\phi_{lens})^{3/4}$ smaller, and (for a constant opening angle α) the effect of disturbing quadrupole fields ($=N_4$) is a factor $\phi_{corr}/\phi_{lens}$ smaller. As a result of this, the demands placed on the stability of the power supplies of the multipole elements are reduced.

An attendant advantage is that, for a constant strength of the corrector, $\kappa_{corr}$, the required excitation is smaller. This is because, for a constant excitation (i.e. a constant effect on the particle beam), the currents required to generate magnetic fields are a factor $\sqrt{\phi_{corr}/\phi_{lens}}$ lower, and the voltages required to generate electric fields are a factor $\phi_{corr}/\phi_{lens}$ lower. As a result of the lower currents and lower voltages, a more compact design of the corrector can be realized.

Another attendant advantage is that the magnification M of the transfer optics is a factor $(\phi_{lens}/\phi_{corr})^{1/4}$ larger. For a given opening angle α, the beam diameter in the corrector is consequently smaller, as a result of which undesirable aberrations of the corrector in the image plane become less significant.

EMBODIMENTS OF THE INVENTION

In what follows, embodiments of the apparatus according to the invention are elucidated.

In an embodiment of the apparatus according to the invention, the beam traverses at least a portion of the corrector with an energy lower than that with which the lens is traversed.

From the preceding discussion, it will be clear that the desired advantages, i.e. satisfying less stringent demands as regards the stability of the power supplies, are achieved.

In a further embodiment of the apparatus according to the invention, the lens is located between the corrector and a chromatically corrected plane.

This embodiment describes the situation that is normally used in the case of an objective lens or a projection lens, whereby a sample is located in a chromatically corrected plane.

In yet a further embodiment of the apparatus according to the invention, transfer optics are located between the corrector and the lens.

Although it is possible to integrate transfer optics into the corrector, whereby some of the parts necessary for the corrector are traversed at an energy lower than the beam energy in the lens and some at an energy equal to that in the lens, most advantages only manifest themselves if all parts of the corrector are traversed at the lower energy and if only thereafter the beam is accelerated to the energy with which the beam traverses the lens.

It ought to be mentioned that a corrector for spherical aberration of the lens can, for example, be placed after the transfer optics, so that both the chromatic aberrations and the spherical aberrations of the lens can be corrected.

In yet another embodiment of an apparatus according to the invention, the magnification of the transfer optics is adjustable.

Often, the ratio of the energy in the lens to the energy in the corrector is not a fixed ratio: the energy in the lens is equal to the energy with which the sample is irradiated and, for different applications, such as different sample constitutions and/or analysis techniques, different energies are employed. If this ratio changes, it can be desirable to change the magnification of the transfer optics, so that the power to the corrector doesn't have to be altered too much—see formula [16].

In yet a further embodiment of the apparatus according to the invention, the energy of the particles at the source-side of the transfer optics is continually lower than at the side of the lens.

In order to accelerate a beam from an energy of, for example, a few keV to an energy of, for example, 300 keV, a relatively expensive accelerator is necessary. A similar accelerator is necessary in order to retard a beam from, for example, 300 keV to a few keV. A substantial saving can be realized by not first accelerating the beam to an energy of, for example, 300 keV, thereafter retarding the beam to a fraction of that energy before it is incident upon the corrector, and thereafter accelerating the beam again (which necessitates three accelerators), but, instead, by only accelerating the beam after this has traversed the corrector, so that only one accelerator is necessary.

An attendant advantage is that, because an accelerator occupies a substantial length of space, this will also lead to a more compact design, e.g. an apparatus with a substantially smaller height than an apparatus that is fitted with three accelerators.

In yet another embodiment of an apparatus according to the invention, the energy with which the beam traverses the corrector is independent of the energy with which the beam traverses the lens.

The energy with which the beam emerges from the particle source is often a constant energy. By choosing the energy with which the beam traverses the corrector to be equal, for example, to the energy with which the beam emerges from the particle source, this energy will also be constant. In this manner, the corrector can be optimized for one particular energy, which makes a cheaper and more compact design possible.

In a further embodiment of the apparatus according to the invention, the beam traverses the corrector with an energy that is less than half of the energy with which the beam traverses the lens.

The invention will now be elucidated on the basis of figures.

Figure 2:
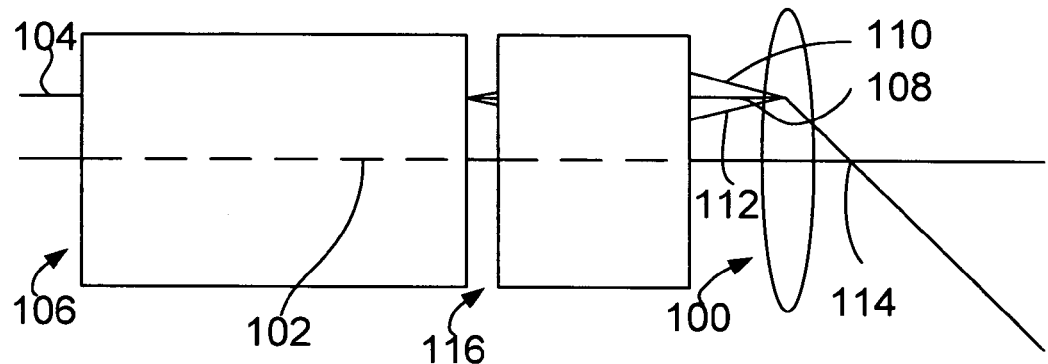
Figure 3:
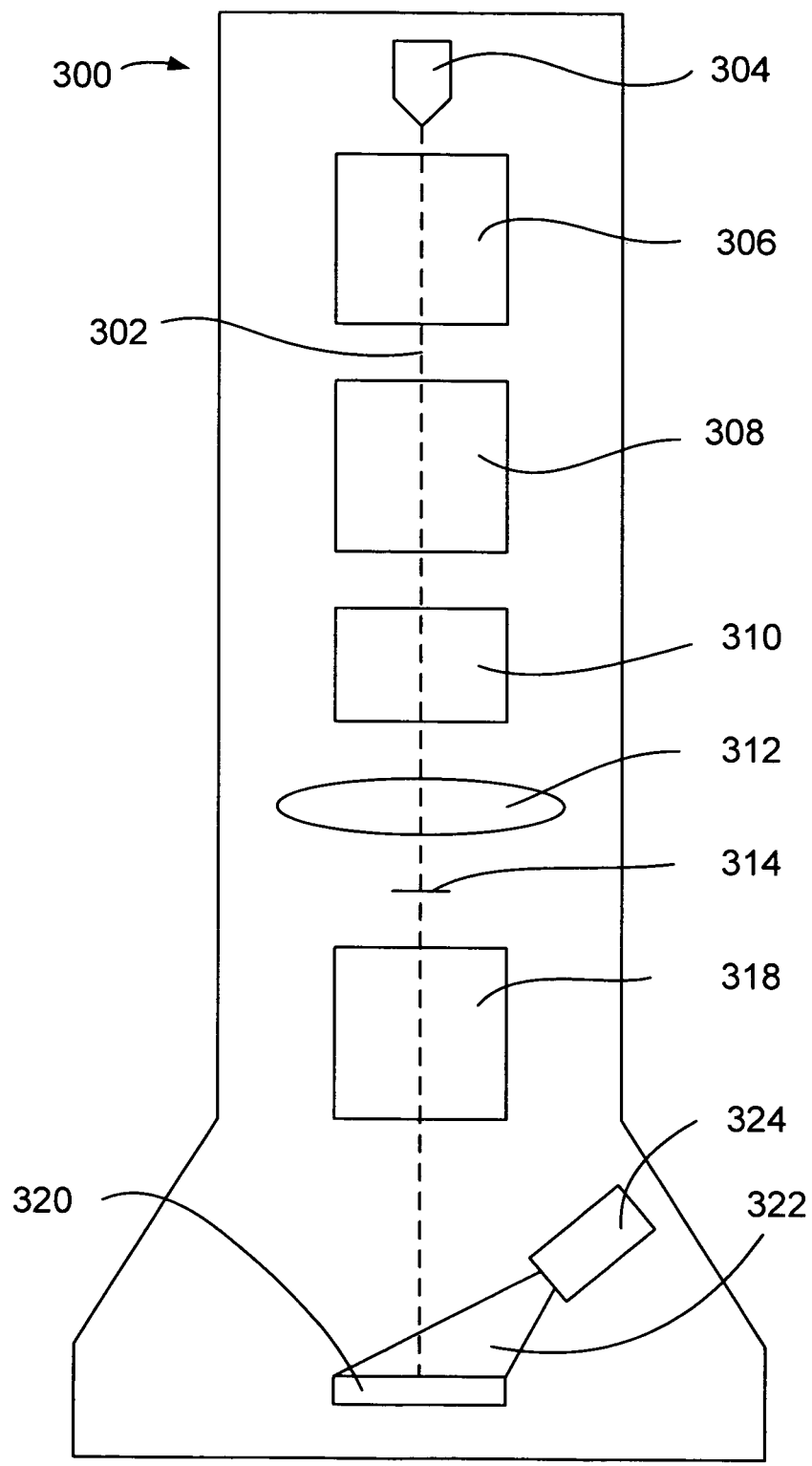
Figure 4:
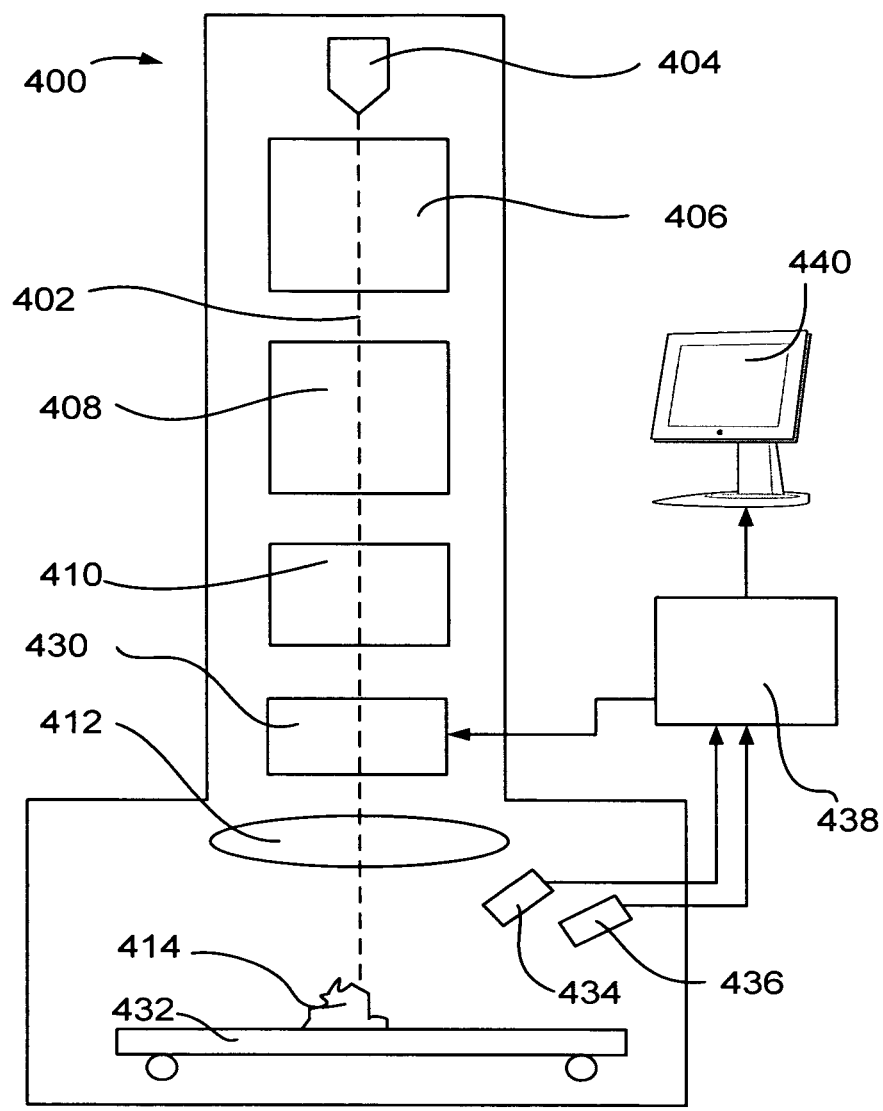

To this end:

FIG. 1 schematically depicts a corrector and a lens;

FIG. 2 schematically depicts a corrector and a lens, with transfer optics between the corrector and the lens;

FIG. 3 schematically depicts a TEM (Transmission Electron Microscope) according to the invention; and, FIG. 4 schematically depicts a SEM (Scanning Electron Microscope) according to the invention.

FIG. 1 schematically depicts a corrector and a lens.

The lens 100 has an optical axis 102 and a focus 114. The optical axis 102 is also the optical axis of the corrector 106. The corrector 106 comprises a plurality of multipoles, such as electric and/or magnetic dipoles, quadrupoles, etc., and can also comprise rotationally symmetric lenses. A beam 104 emerges from a non-depicted particle source on the left hand side of the drawing, and is incident upon the corrector 106. The corrector 106 will split the beam 104 into several component beams 108, 110 and 112, whereby the particles in each component beam have a different energy. The particles in component beam 108 have, for example, the nominal energy, those in component beam 110 a lower energy than the nominal energy, and those in component beam 112 an energy higher than the nominal energy. Because the lens action of the lens 100 is stronger for component beam 110 than that for component beam 112 (which, after all, has a higher energy), the different component beams will be imaged at the focus of the lens, regardless of the energy of the particles in the beams.

FIG. 2 schematically depicts a corrector and a lens, with transfer optics between the corrector and the lens.

FIG. 2 can be regarded as having arisen out of FIG. 1, whereby transfer optics 116 are placed between the corrector 106 and the lens 100. These transfer optics generally comprise lenses, and can also comprise an accelerator that accelerates the particles in the (component) beams to the energy with which they traverse the lens. The transfer optics are hereby constructed in such a manner that the component beams intersect one another in the principal plane of the lens. As a result, instead of an achromatic plane, there is an achromatic space at that side, which offers greater flexibility.

FIG. 3 schematically depicts a TEM according to the invention. In this TEM 300, a particle source in the form of an electron source 304 produces a beam of electrons, which propagate along an optical axis 302. The electrons emerge from the electron source 304 with a relatively low energy of, for example, 3 keV. A condenser system 306 forms an image of the electron source with an adjustable magnification, after which the electrons are incident upon the corrector 308. Such a condenser system typically consists of two or more rotationally symmetric lenses. As explained earlier, in the corrector 308, the beam is split into different component beams, each having a different energy. The electrons in these component beams are subsequently accelerated in transfer optics 310 to an energy of nominally 300 keV, for example, and are incident upon the objective lens 312. This objective lens images all electrons in the different component beams at the focus of this lens, where a sample 314 is located.

A portion of the electrons in the beam will pass through the sample 314, and may demonstrate, for example, a phase shift and/or an energy loss as a result of this passage. These electrons are imaged by an imaging system 318, consisting of a magnifying arrangement of one or more lenses, onto a fluorescent screen 320, where the incident electrons produce light. This light 322 can be inspected with the naked eye, or, for example, with the aid of a CCD camera 324.

It ought to be mentioned that the magnifying set 318 can also comprise a corrector, which corrects the aberrations of the projection lens.

FIG. 4 schematically depicts a SEM according to the invention. In this SEM 400, a particle source in the form of an electron source 404 produces a beam of electrons, which propagate along an optical axis 402. The electrons emerge from the electron source 404 with a relatively low energy of, for example, 3 keV. A condenser system 406 forms an image of the electron source with an adjustable magnification, after which the electrons are incident upon the corrector 408. Such a condenser system typically consists of two or more rotationally symmetric lenses. As explained earlier, in the corrector 408, the beam is split into different component beams, each having a different energy. The electrons in these component beams are subsequently accelerated in transfer optics 410 to an energy of nominally 30 keV, for example, and are incident upon the objective lens 412. This objective lens images all electrons in the different component beams at the focus of this lens, where a sample 414 is located. This sample is mounted on a movable sample holder 432. In this manner, the portion of the sample that is of interest can be positioned in the direct vicinity of the optical axis.

Between the objective lens 412 and the transfer optics 410, a deflection unit 430 is placed, which deflects the beam in such a manner that this is rastered ("scanned") across the sample. This rastering occurs under the control of a control unit 438. In this manner, (position-dependent) information is produced in the form of, for example, secondary electrons and X-ray radiation, which is detected with the aid of detectors 434 and 436. The signals from these detectors 434 and 436 are passed to the control unit 438, which, with the aid of these signals, subsequently constructs an image that is imaged on monitor 440.

It ought to be mentioned that, if the electron source in FIG. 4 is replaced by an ion source, the operation of a FIB apparatus according to the invention will be described.

The invention claimed is:

1. A particle-optical apparatus arranged to focus a beam of electrically charged particles, provided with:
    a particle source for generating the beam, the particle source being maintained at a first electrical potential such that the electrically charged particles having a first nominal energy when exiting the particle source;
    a particle-optical lens for focusing the beam, the particle-optical lens being maintained at a second potential greater than the first potential such that electrically charged particles traversing the particle-optical lens at a second nominal energy greater than the first nominal energy;
    a corrector for correcting the chromatic lens errors occurring in the lens, the corrector being maintained at a third potential so that the electrically charged particles traversing the corrector with a nominal energy less than the second nominal energy; and
    transfer optics for accelerating the beam of electrically charged particles such that the electrically charged particles traverse the lens at said second nominal energy, wherein the beam traverses the transfer optics after traversing the corrector.

2. A particle-optical apparatus according to claim 1, in which the lens is located between the corrector and a chromatically corrected plane.

3. A particle-optical apparatus according to claim 1, in which the transfer optics are located between the corrector and the lens.

4. A particle-optical apparatus according to claim 3, in which the magnification of the transfer optics is adjustable.

5. A particle-optical apparatus according to claim 3, in which the electrical potentials within the particle optical apparatus are configured so that the energy of the particles at the source-side of the transfer optics is continually lower than at the other side.

6. A particle-optical apparatus according to claim 5, in which the electrical potentials within the particle optical apparatus are configured so that the energy with which the beam traverses at least a portion of the corrector is independent of the energy with which the beam traverses the lens.

7. A particle-optical apparatus according to claim 1, in which the electrical potentials within the particle optical apparatus are configured so that the beam traverses at least a portion of the corrector with an energy that is less than half of the energy with which the beam traverses the lens.

8. A particle-optical apparatus according to claim 2, in which transfer optics are located between the corrector and the lens.

9. A particle-optical apparatus according to claim 8, in which the magnification of the transfer optics is adjustable.

10. A particle-optical apparatus according to claim 9, in which the electrical potentials within the particle optical apparatus are configured so that the energy of the particles at the source-side of the transfer optics is continually lower than at the other side.

11. A particle-optical apparatus according to claim 10, in which the electrical potentials within the particle optical apparatus are configured so that the energy with which the beam traverses at least a portion of the corrector is independent of the energy with which the beam traverses the lens.

12. A particle-optical apparatus according to claim 4, in which the electrical potentials within the particle optical apparatus are configured so that the energy with which the beam traverses at least a portion of the corrector is independent of the energy with which the beam traverses the lens.

13. A particle-optical apparatus according to claim 8, in which the electrical potentials within the particle optical apparatus are configured so that the energy of the particles at the source-side of the transfer optics is continually lower than at the other side.

14. A particle-optical apparatus according to claim 1, in which the beam of electrically charged particles traverses the transfer optics after traversing the corrector in its entirety.

15. A particle-optical apparatus according to claim 1, in which the transfer optics for accelerating the beam of electrically charged particles accelerate all electrically charged particles in the beam.

\* \* \* \* \*